(12) United States Patent
Suzuki

(10) Patent No.: US 7,250,883 B2
(45) Date of Patent: Jul. 31, 2007

(54) A/D CONVERTER

(75) Inventor: Hisao Suzuki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/261,486

(22) Filed: Oct. 31, 2005

(65) Prior Publication Data

US 2006/0290551 A1  Dec. 28, 2006

(30) Foreign Application Priority Data

Jun. 23, 2005  (JP) .............................. 2005-183828

(51) Int. Cl.
*H03M 1/00* (2006.01)
(52) U.S. Cl. ..................... 341/135; 341/126
(58) Field of Classification Search ............... 341/135, 341/155, 156, 161, 162, 126, 120
See application file for complete search history.

(56) References Cited

U.S. PATENT DOCUMENTS

| 4,179,687 A | | 12/1979 | Van De Plassche et al. |
| 5,283,582 A | * | 2/1994 | Krenik ........................ 341/158 |
| 5,719,578 A | * | 2/1998 | Bohme ........................ 341/161 |
| 6,313,780 B1 | * | 11/2001 | Hughes et al. ............... 341/156 |
| 6,909,394 B2 | * | 6/2005 | Doerrer et al. ............. 341/200 |
| 2004/0080446 A1 | | 4/2004 | Chen et al. |
| 2004/0145504 A1 | * | 7/2004 | Doerrer et al. ............. 341/143 |
| 2005/0035892 A1 | * | 2/2005 | Devendorf et al. ......... 341/153 |

FOREIGN PATENT DOCUMENTS

| EP | 0 932 047 A1 | 7/1999 |
| JP | 08-079080 A | 3/1996 |

* cited by examiner

*Primary Examiner*—Rexford Barnie
*Assistant Examiner*—Joseph Lauture
(74) *Attorney, Agent, or Firm*—Arent Fox LLP

(57) ABSTRACT

A compact and highly accurate A/D converter includes series-connected computation cells, the number of which is equal to the number for bits in an output signal. The first computation cell includes a first comparison unit for subtracting a reference current from a first input current to generate a first current, and a second comparison unit for subtracting a second input current from the reference current to generate a second current. The second computation cell includes first and second comparison units having the same configurations as those in the first computation cell. The computation cells of latter stages have the same configurations as the second computation cell. Current mirror circuits included in the first and second comparison units of each computation cell generate the first and second currents. Each computation cell outputs a current having an absolute value in accordance with one of the first and second currents.

10 Claims, 3 Drawing Sheets

A/D CONVERTER

CROSS-REFERENCE TO RELATED APPLICATIONS

This application is based upon and claims the benefit of priority from prior Japanese Patent Application No. 2005-183828, filed on Jun. 23, 2005, the entire contents of which are incorporated herein by reference.

BACKGROUND OF THE INVENTION

The present invention relates to an analog-to-digital (A/D) converter for converting an analog input current into a digital value.

Japanese Laid-Open Patent Publication No. 8-79080 describes a current mode A/D converter for converting an analog input signal current into a digital value. The A/D converter has a hierarchical tree configuration that is formed by a plurality of current mirror circuits. An input signal current is distributed to a plurality of branched current paths in the A/D converter. As the input signal current propagates through the current paths, the input signal current is subjected to hierarchical computation including subtraction and addition using a reference current. The resulting current is finally compared with the reference current. As a result, the A/D converter outputs a digital value.

SUMMARY OF THE INVENTION

The A/D converter described in the above publication requires one circuit stage to be added for every increase of one bit to the digital value, that is, whenever increasing the resolution of the analog amount. The A/D circuit of the above publication has a tree configuration. Thus, when one circuit stage is added to the A/D circuit, the added circuit must have a circuit scale that is twice as large as the scale of the final circuit stage before the addition. Thus, the addition of one circuit stage to the A/D converter almost doubles the entire circuit area of the A/D converter. An increase in the A/D conversion resolution for a semiconductor chip on which only the A/D converter of the above publication is integrated or for a semiconductor chip on which the A/D converter of the above publication is integrated together with other circuits greatly increases the circuit scale of the A/D converter. Therefore, in the prior art, it is difficult to increase the number of bits of the digital value without increasing the circuit scale of the A/D converter.

Further, in the A/D converter described in the above publication, each of the circuit stages must be supplied with the same reference current. Thus, more reference currents become necessary in latter circuit stages. It is difficult to supply each of the circuit stages with reference currents having the same values. Thus, different reference currents may be supplied to the circuit stages. Such differences in the reference currents lower the conversion accuracy of the digital value.

One aspect of the present invention is an A/D converter for converting an analog input current into a digital output signal having a plurality of bits. The A/D converter includes plural stages of series-connected computation cells, the number of which is equal to the number of bits in said plurality of bits of the digital output signal. The computation cells respectively are supplied with a plurality of input currents, have a plurality of reference currents to compute differences between the corresponding input currents and reference currents, and output a plurality of currents in accordance with absolute values of said differences. An encoder, connected to the computation cells, determine values for the plurality of bits based on the computations of the computation cells.

Another aspect of the present invention is an A/D converter for converting an analog input current into a digital output signal having a plurality of bits. The A/D converter includes plural stages of series-connected computation cells, the number of which is equal to the number of bits in said plurality of bits of the digital output signal. The computation cells respectively are supplied with a plurality of input currents and have a plurality of reference currents. Each of the computation cells supply the computation cell of a latter stage with difference currents, of the corresponding input current and a corresponding reference current, and a current having an absolute value in accordance with one of the difference currents. An encoder determines values for the plurality of bits of the digital output signal based on the difference current of the computation cells. The encoder includes plural stages of encoder units respectively connected to the computation cells. The number of the encoder units is equal to the number of bits in said plurality of bits. The encoder unit in a first stage determines a value for a first bit of the digital output signal in accordance with the difference current supplied from the corresponding computation cell. The encoder units in second and latter stages determine values of second and latter bits of the digital output signal in accordance with the difference currents supplied from the corresponding computation cells and the value determined by the encoder unit of a preceding stage.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

An A/D converter according to a preferred embodiment of the present invention will now be described with reference to FIGS. 1 and 3.

Figure 1:
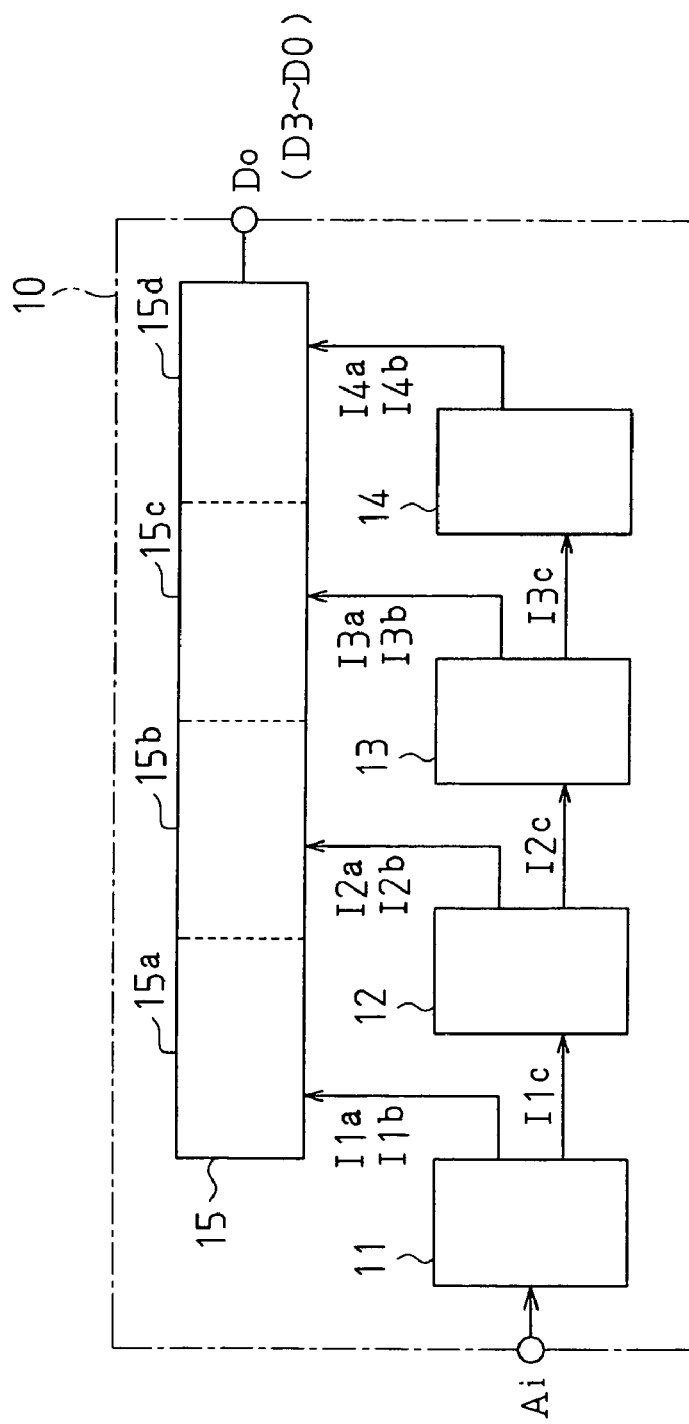
FIG. 1 is a block circuit diagram of an A/D converter according to a preferred embodiment of the present invention.

FIG. 1 shows an A/D converter 10, which converts an input current Ai as an analog amount into a signal Do having a digital value of a plurality of bits (e.g., four bits).

The A/D converter 10 includes a plurality of stages (e.g., four stages) of computation cells 11 to 14 and an encoder 15. The encoder 15 is connected to the computation cells 11 to 14. The computation cells 11 to 14 are connected to one another in series.

The first computation cell 11, which is the first stage circuit, is supplied with input current Ai as an analog amount. The first computation cell 11 compares the input current Ai with a reference current and generates output currents (comparison result currents or difference currents) I1a and I1b. The output currents I1a and I1b are in accordance with the comparison result and flow in opposite directions. The directions in which the output currents I1a and I1b flow are determined in accordance with the comparison result of the input current Ai and the reference current. The first computation cell 11 includes a current mirror circuit (mirror circuit). The first computation cell 11 outputs a current I1c, which is substantially equal to the one of the output currents I1a and I1b that can be mirrored by the mirror circuit.

The second computation cell 12 is connected to the first computation cell 11 and receives the output current I1c of the first computation cell 11. The second computation cell 12 compares the output current I1c of the first computation cell 11 with a reference current and generates output currents (comparison result currents or difference currents) I2a and I2b. The output currents I2a and I2b are in accordance with the comparison result and flow in opposite directions. The directions in which the output currents I2a and I2b flow are determined in accordance with the comparison result of the currents I1a and I1b and the reference current. The second computation cell 12 includes a mirror circuit. The second computation cell 12 outputs a current I2c, which is substantially equal to the one of the output currents I2a and I2b that can be mirrored by the mirror circuit.

In the same manner, the third computation cell 13 compares the output current I2c of the second computation cell 12 with a reference current and generates output currents (comparison result currents or difference currents) I3a and I3b. The output currents I3a and I3b are in accordance with the comparison result and flow in opposite directions. The third computation cell 13 outputs a current I3c, which is substantially equal to the one of the output currents I3a and I3b that can be mirrored by a mirror circuit included in the third computation cell 13.

The fourth computation cell 14, which is the final stage circuit, compares the output current I3c of the third computation cell 13 with a reference current and generates output currents I4a and I4b. The output currents I4a and I4b are in accordance with the comparison result and flow in opposite directions.

The encoder 15 generates a signal Do having a digital value of four bits based on the currents I1a, I1b, I2a, I2b, I3a, I3b, I4a, and I4b, which are provided as computation results from the computation cells 11 to 14. In detail, the encoder 15 compares the two output currents of each of the computation cell 11 to 14, namely, the currents I1a and I1b, I2a and I2b, I3a and I3b, and I4a and I4b. Then, based on the comparison result of each computation cell and the comparison result of the preceding cell, the encoder 15 determines the value of each bit. The first computation cell 11 is the first stage circuit and does not have a preceding computation cell. Therefore, the encoder 15 determines the value of the first bit based only on the comparison result of the currents I1a and I1b of the first computation cell 11.

Figure 2:
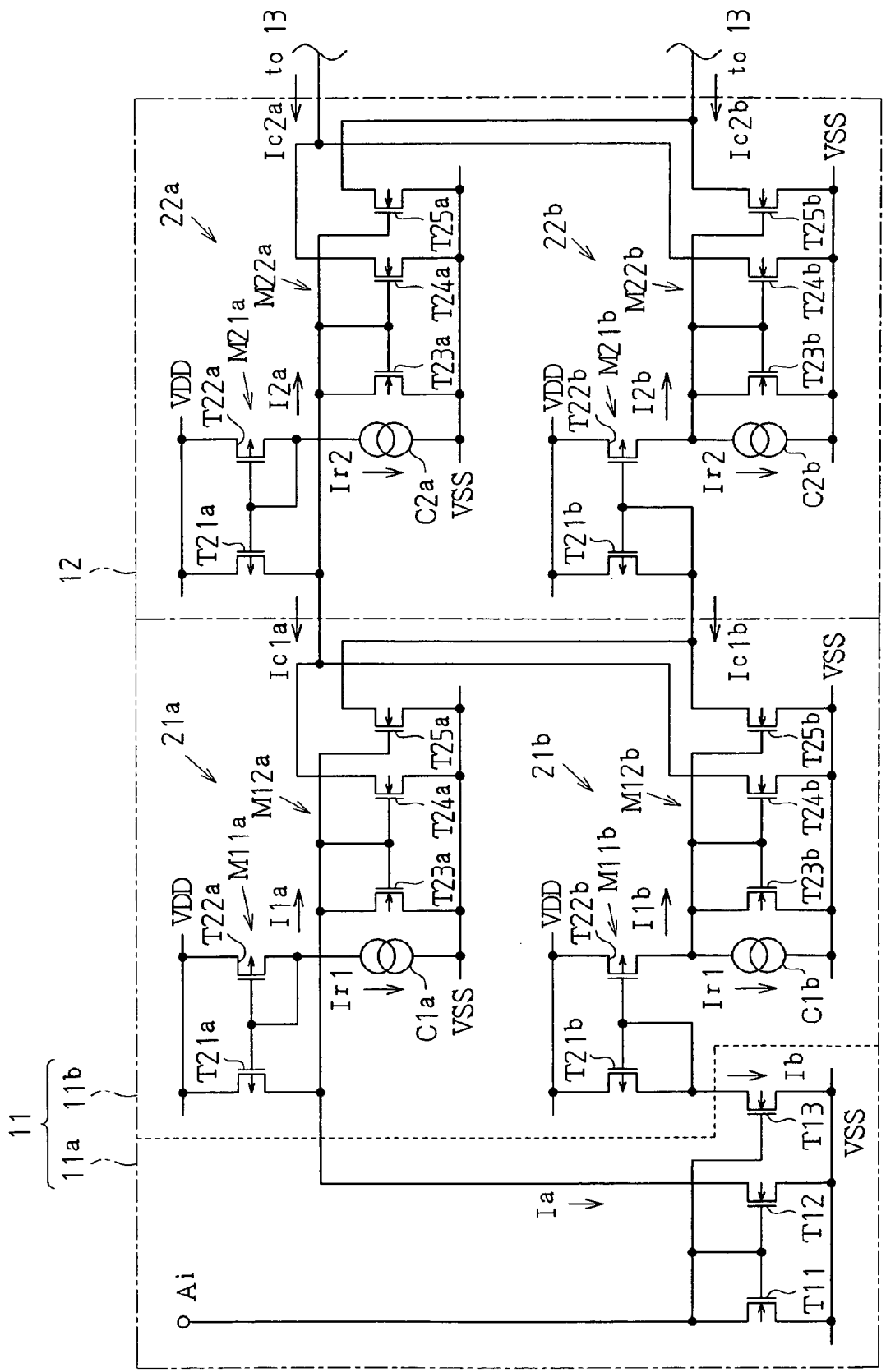
FIG. 2 is a circuit diagram of computation cells of the first and second stages of the A/D converter of FIG. 1.

The computation cells 11 to 14 will now be described with reference to FIG. 2.

The first computation cell 11 includes an input unit 11a, which functions as an input circuit, and a computation unit 11b. The input unit 11a is formed by a current mirror circuit for generating two currents Ia and Ib having the same values as the input current Ai. The input unit 11a includes three N-channel metal oxide semiconductor (MOS) transistors T11, T12, and T13 having the same electrical characteristics. The gates of the N-channel MOS transistors T11, T12, and T13 are connected to one another. The input current Ai is supplied to the drain of the first transistor T11. The gate and the drain of the first transistor T11 are connected to each other. The source of the first transistor T11 is connected to a low-potential power supply VSS. The gate of the second transistor T12 is connected to the gate of the first transistor T11. The source of the second transistor T12 is connected to the low-potential power supply VSS. The drain of the second transistor T12 is connected to the computation unit 11b. The first current Ia having the same value as the input current Ai flows between the drain and the source of the second transistor T12. The gate of the third transistor T13 is connected to the gate of the first transistor T11. The source of the third transistor T13 is connected to the low-potential power supply VSS. The drain of the third transistor T13 is connected to the computation unit 11b. The second current Ib having the same value as the input current Ai flows between the drain and the source of the third transistor T13. The input unit 11a provides the computation unit 11b with the first current Ia and the second current Ib.

The computation unit 11b compares each of the first current Ia and the second current Ib with a reference current, and generates the currents I1a and I1b. The currents I1a and I1b are in accordance with the comparison results and flow in opposite directions. The directions in which the output currents I1a and I1b flow are determined in accordance with the comparison result of the input current Ai and the reference current. The computation cell 11b includes a mirror circuit. The mirror circuit outputs, as a current I1c (refer to FIG. 1), one of the output currents I1a and I1b that is substantially equal to a current that can be mirrored.

The computation cell 11b includes a first comparison unit 21a and a second comparison unit 21b. The first comparison unit 21a compares the first current Ia with the reference current. The second comparison unit 21b compares the second current Ib with the reference current.

The first comparison unit 21a includes a first mirror circuit M11a, a second mirror circuit M12a, and a constant current supply C1a. The first mirror circuit M11a includes two P-channel MOS transistors T21a and T22a having the same electrical characteristics. The gates of the two P-channel MOS transistors T21a and T22a are connected to each other. The first transistor T21a has a source connected to a high-potential power supply VDD and a drain connected to the second transistor T12 of the input unit 11a. The second transistor T22a has a source connected to the high-potential power supply VDD and a drain connected to its gate and to a first terminal of the constant current supply C1a. The constant current supply C1a has a second terminal connected to a low-potential power supply VSS. The drain of the first transistor T21a is connected to the second mirror circuit M12a. The constant current supply C1a generates a reference current Ir1 having a predetermined current amount. The predetermined current amount of the reference current Ir1 is set, for example, in accordance with the range of the analog amount provided to the A/D converter 10. In the preferred embodiment, the analog amount is in the range of 0 to 160 μA. The reference current Ir1 is set at a value (80 μA) obtained by dividing the total of a maximum value and a minimum value of the analog amount range by two. Alternatively, the reference current Ir1 may be set at another value.

The first mirror circuit M11a supplies the first transistor T21a with substantially the same amount of current as the reference current Ir1. The second transistor T12 of the input unit 11a and the second mirror circuit M12a are connected to the drain of the first transistor T21a. Thus, the first comparison unit 21a supplies the second mirror circuit M12a with a current I1a (Ir1−Ia) having a current value obtained by subtracting the first current Ia from the reference current Ir1.

The second mirror circuit M12a includes three N-channel MOS transistors T23a, T24a, and T25a having the same electrical characteristics. The gates of the three N-channel MOS transistors T23a, T24a, and T25a are connected to one another. The third transistor T23a has a source connected to the low-potential power supply VSS and a drain connected to the first transistor T21a of the first mirror circuit M11a. The gate and the drain of the third transistor T23a are connected to each other. The sources of the fourth transistor T24a and the fifth transistor T25a are connected to the low-potential power supply VSS. Currents having substantially the same current values flow through the third transistor T23a, the fourth transistor T24a, and the fifth transistor T25a of the second mirror circuit M12a.

The second comparison unit 21b includes a first mirror circuit M11b, a second mirror circuit M12b, and a constant current supply C1b. The constant current supply C1b has the same electrical characteristic as the constant current supply C1a of the first comparison unit 21a and generates a reference current Ir1. The second comparison unit 21b is formed so as to output a comparison result of the second current Ib and the reference current Ir1, which is generated by the constant current supply C1b, that is opposite to the comparison result of the first comparison unit 21a.

More specifically, the first mirror circuit M11b is formed by two P-channel MOS transistors T21b and T22b having the same electrical characteristics. The gates of the two P-channel MOS transistors T21b and T22b are connected to each other. The source of the first transistor T21b is connected to a high-potential power supply VDD. The drain of the first transistor T21b is connected to the gate of the first transistor T21b and to the third transistor T13 of the input unit 11a. The source of the second transistor T22b is connected to the high-potential power supply VDD. The drain of the second transistor T22b is connected to a first terminal of the constant current supply C1b. A second terminal of the constant current supply C1b is connected to a low-potential power supply VSS. The drain of the second transistor T22b is connected to the second mirror circuit M12b.

The first mirror circuit M11b supplies the second transistor T22b with substantially the same amount of current as the second current Ib, which flows through the first transistor T21b. The constant current supply C1b and the second mirror circuit M12b are connected to the drain of the second transistor T22b. Thus, the second comparison unit 21b supplies the second mirror circuit M12b with a current I1b (Ib−Ir1) having a current value obtained by subtracting the reference current Ir1 from the second current Ib.

The second mirror circuit M12b is formed by three N-channel MOS transistors T23b, T24b, and T25b having the same electrical characteristics. The gates of the three N-channel MOS transistors T23b, T24b, and T25b are connected to one another. The third transistor T23b has a source connected to the low-potential power supply VSS and a drain connected to the second transistor T22b of the first mirror circuit M11b. The gate and the drain of the third transistor T23b are connected to each other. The source of the fourth transistor T24b is connected to the low-potential power supply VSS. The drain of the fourth transistor T24b is connected to the drain of the fourth transistor T24a included in the second mirror circuit M12a of the first comparison unit 21a and to the second computation cell 12 of the next stage. The source of the fifth transistor T25b is connected to the low-potential power supply VSS. The drain of the fifth transistor T25b is connected to the drain of the fifth transistor T25a included in the second mirror circuit M12a of the first comparison unit 21a and to the second computation cell 12 of the next stage. Currents having substantially the same current values flow through the third transistor T23b, the fourth transistor T24b, and the fifth transistor T25b of the second mirror circuit M12b.

The first current Ia and the second current Ib have the same current values. The constant current supplies C1a and C1b generate the same reference current Ir1. Thus, the current I1a and the current I1b, which are the comparison results of the first comparison unit 21a and the second comparison unit 21b, have substantially the same values (current amounts), and flow in opposite directions. In other words, the relationship between the current I1a and the current I1b is expressed as I1a=−I1b (or −I1a=I1b), in which the current marked with "+" flows in a direction from the first mirror circuits M11a and M11b to the second mirror circuits M12a and M12b and the current marked with "−" flows in an opposite direction.

The second mirror circuits M12a and M12b do not mirror a current marked with "−", that is, a current flowing in the direction from the second mirror circuits M12a and M12b to the first mirror circuits M11a and M11b, and do not supply current marked with "−" to the transistors T24a, T25a, T24b, and T25b. Thus, the one of the first comparison unit 21a and the second comparison unit 21b in the computation unit 11b, through which the current marked with "+" (I1a or I1b) flows, outputs a first current (first output current) Ic1a and a second current (second output current) Ic1b having the same current amount as the current marked with "+" but does not output the current marked with "−". In other words, the first current Ic1a and the second current Ic1b output by the computation unit 11b have the same current amounts as one of the current I1a and the current I1b. The current I1a is generated by the first mirror circuit M11a of the first comparison unit 21a. The current I1b is generated by the first mirror circuit M11b of the second comparison unit 21b. The first current Ic1a is a current that flows through the fourth transistor T24a of the first comparison unit 21a or the fourth transistor T24b of the second comparison unit 21b. The second current Ic1b is a current that flows through the fifth transistor T25a of the first comparison unit 21a or the fifth transistor T25b of the second comparison unit 21b. The current I1c shown in FIG. 1 represents the first current Ic1a and the second current Ic1b. The computation unit 11b outputs the third current I1c (the first current Ic1a and the second current Ic1b) having an absolute value of a difference between the reference current Ir1 and the input current (the first current Ia and the second current Ib). The third current I1c is generated by the second mirror circuits M12a and M12b.

The second computation cell 12 will now be described. The second computation cell 12 includes the same transistors as the transistors included in the first computation cell 11. Thus, these transistors will not be described.

The second computation cell 12 has the same configuration as the computation unit 11b included in the first computation cell 11. In detail, the second computation cell 12 includes a first comparison unit 22a and a second comparison unit 22b. The first comparison unit 22a receives the first current Ic1a of the first computation cell 11. The second comparison unit 22b receives the second current Ic1b of the first computation cell 11. The first comparison unit 22a has the same configuration as the first comparison unit 21a included in the computation unit 11b of the first computation cell 11. The first comparison unit 22a includes a first mirror circuit M21a, a second mirror circuit M22a, and a constant current supply C2a. The second comparison unit 22b has the same configuration as the second comparison unit 21b included in the computation unit 11b of the first computation cell 11. The second comparison unit 22b includes a first mirror circuit M21b, a second mirror circuit M22b, and a constant current supply C2b.

The constant current supplies C2a and C2b both generate a reference current Ir2, which is determined in accordance with the number of the stages of the computation cells. In the preferred embodiment, the reference current Ir2 is set at a value that is one half the reference current Ir1 of the first computation cell 11.

The first comparison unit 22a generates current I2a (Ir2−Ic1a) having a current value obtained by subtracting the first current Ic1a from the reference current Ir2. The second comparison unit 22b generates current I2b (Ic1b−Ir2) having a current value obtained by subtracting the reference current Ir2 from the second current Ic1b. The second computation cell 12 outputs a first current Ic2a and a second current Ic2b, which are substantially equal to the one of the two currents I2a and I2b (I2a or I2b) that can be mirrored by the second mirror circuits M22a and M22b. The current I2c shown in FIG. 1 represents the first current Ic2a and the second current Ic2b.

The first mirror circuits M11a and M11b are formed by the P-channel MOS transistors T21a, T22a, T21b, and T22b. The second mirror circuits M12a and M12b are formed by the N-channel MOS transistors T23a to T25a and T23b to T25b. In other words, the conductivity type of the transistors included in the first mirror circuits M11a and M11b differs from the conductivity type of the transistors included in the second mirror circuits M12a and M12b. The same applies to the relationship between the second mirror circuits M12a and M12b included in the computation unit 11b of the first computation cell 11 and the first mirror circuits M21a and M21b included in the second computation cell 12. A current that can be mirrored by the second mirror circuits M12a and M12b of the first computation cell 11 is a current flowing from the drains to the sources of the MOS transistors T23a to T25a and T23b to T25b included in the second mirror circuits M12a and M12b. The direction in which this current flows coincides with the direction in which the current flows through the P-channel MOS transistors T21a and T21b of the first mirror circuits M21a and M21b included in the computation cell of the next stage. Thus, the first computation cell 11 selects the one of the two currents I1a and I1b, which are generated by the first mirror circuits M11a and M11b and the constant current supplies C1a and C1b and flow in directions different from each other, that flows in the same direction as the direction in which the current flows through the first mirror circuits M21a and M21b of the second computation cell 12 of the next stage. The first computation cell 11 then outputs the two first and second currents that are substantially the same as the selected current via the fourth and fifth transistors of the second mirror circuit corresponding to the selected current.

The relationship between the conductivity type of the transistors included in the second mirror circuits M12a and M12b and the conductivity type of the transistors included in the first mirror circuits M11a and M11b is the same as the relationship between the conductivity type in the input unit 11a and the conductivity type in the first mirror circuits M11a and M11b. In other words, the conductivity type of the transistors included in the input unit 11a differs from the conductivity type of the transistors included in the first mirror circuits M11a and M11b.

The third computation cell 13 and the fourth computation cell 14 have the same configurations as the second computation cell 12. In other words, the second computation cell 12, the third computation cell 13, and the fourth computation cell 14 have the same configurations as the computation unit 11b included in the first computation cell 11. Thus, the A/D converter 10 includes the input unit 11a and the four computation cells (11b, 12, 13, and 14), which have the same configurations.

The constant current supplies included in each of the third computation cell 13 and the fourth computation cell 14 generates a reference current that is one half the reference current generated by the constant current supply in the computation cell of the preceding stage. For example, the constant current supplies included in the first comparison unit and the second comparison unit of the third computation cell 13 generate reference current Ir3 that is one half the reference current Ir2 generated by the constant current supplies C2a and C2b included in the second computation cell 12 of the preceding stage. The constant current supplies included in the first comparison unit and the second comparison unit of the fourth computation cell 14 generate a reference current Ir4 that is one half the reference current Ir3 generated by the constant current supplies included in the third computation cell 13 of the preceding stage.

The encoder 15 will now be described with reference to FIG. 3.

Figure 3:
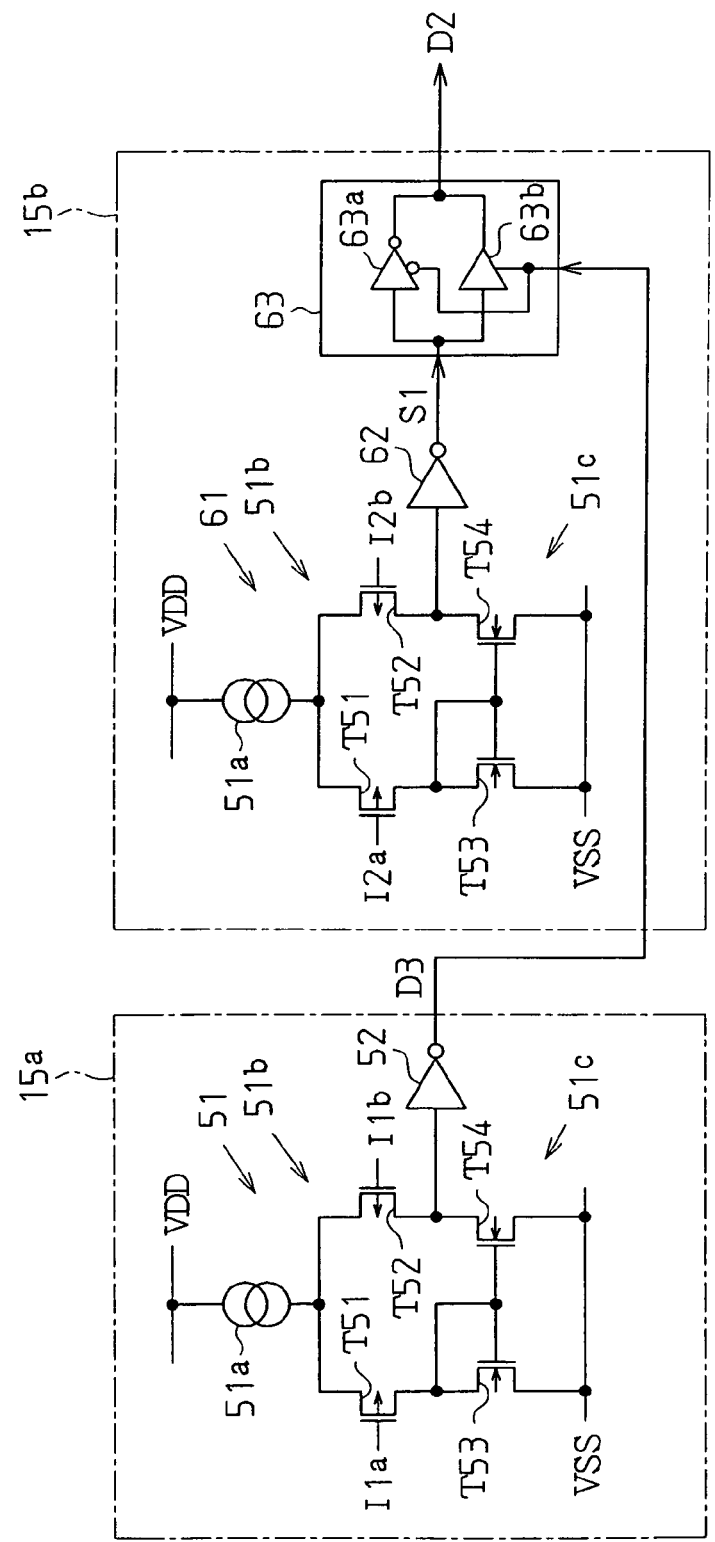
FIG. 3 is a partial circuit diagram of an encoder included in the A/D converter of FIG. 1.

FIG. 3 is a partial circuit diagram of the encoder 15. FIG. 3 shows encoder units 15a and 15b corresponding to the first computation cell 11 and the second computation cell 12, respectively.

The first encoder unit 15a includes a differential amplifier circuit 51 and an inverter circuit 52. The differential amplifier circuit 51 includes a constant current supply 51a, a differential input unit 51b, and a current mirror unit 51c. The first terminal of the constant current supply 51a is connected to a high-potential power supply VDD. The second terminal of the constant current supply 51a is connected to the differential input unit 51b. The differential input unit 51b includes a pair of MOS transistors (P-channel MOS transistors) T51 and T52. The sources of the transistors T51 and T52 are connected to each other. A connection node between the sources of the transistors T51 and T52 is connected to the constant current supply 51a. The drains of the transistors T51 and T52 are connected to the current mirror unit 51c. The gate of the first transistor T51 is supplied with a first current I1a, and the gate of the second transistor T52 is supplied with a second current I1b. The current mirror unit 51c includes a pair of MOS transistors (N-channel MOS transistors) T53 and T54. The sources of the transistors T53 and T54 are connected to a low-potential power supply VSS. The drain of the third transistor T53 is connected to the drain of the first transistor T51. The drain of the fourth transistor T54 is connected to the drain of the second transistor T52. The gate of the fourth transistor T54 is connected to the gate of the third transistor T53. The drain of the third transistor T53 included in the current mirror unit 51c is connected to the gate of the third transistor T53. The drain of the fourth transistor T54 included in the current mirror unit 51c is connected to the inverter circuit 52.

The first encoder unit 15a outputs a one-bit signal D3 having a value of either 1 or 0 in accordance with the comparison result between the first current I1a and the second current I1b. For example, the first encoder unit 15a outputs a low (L) level signal D3 having a value of 0 when the first current I1a is greater than the second current I1b and outputs a high (H) level signal D3 having a value of 1 when the first current I1a is less than the second current I1b.

The second encoder unit 15b includes a differential amplifier circuit 61, an inverter circuit 62, and a bit adjustment circuit 63. The differential amplifier circuit 61 has the same configuration as the differential amplifier circuit 51 of the first encoder unit 15a.

The bit adjustment circuit 63 is formed, for example, by a three-state inversion buffer 63a and a three-state non-inversion buffer 63b. The input terminals of the buffers 63a and 63b are provided with an output signal S1 from the inverter circuit 62. The control terminals of the buffers 63a and 63b are provided with the output signal D3 from the first encoder unit 15a. The output signal of either the inversion buffer 63a or the non-inversion buffer 63b is output as a signal D2.

When the bit adjustment circuit 63 is provided with an H level signal D3 having a value of 1, the output signal of the non-inversion buffer 63b is output as the signal D2. When the bit adjustment circuit 63 is provided with an L level signal D3 having a value of 0, the output signal of the inversion buffer 63a is output as the signal D2. The output signal of the inverter circuit 62 is commonly input into the buffers 63a and 63b. Thus, the bit adjustment circuit 63 outputs a signal D2 having substantially the same level as the output signal S1 of the inverter circuit 62 when the signal D3 is at an H level having a value of 1 and outputs a signal D2 having a level obtained by inverting the level of the output signal S1 when the output signal D3 is at an L level having a value of 0.

The bit adjustment circuit 63 outputs the one-bit signal D2 having a level determined in accordance with the output signal S1 of the inverter circuit 62 and the output signal D3 of the first encoder unit 15a. The bit adjustment circuit 63 inverts the output value of the inverter circuit 62 and outputs the signal D2 having the inverted value when the computation result of the first computation cell 11 of the preceding stage is negative, that is, when the output of the encoder unit 15a corresponding to the first computation cell 11 is 0 (L level).

As described above, the first current I1a and the second current I1b are generated as the comparison results of the input current (the first current Ia and the second current Ib) and the reference current Ir1 and are currents that have the same absolute values but flow in different directions. The relationship between the current I1a and the current I1b of the computation unit 11b of the first computation cell 11 is expressed as I1a=-I1b (or -I1a=I1b), where the current marked with "+" flows in a direction from the first mirror circuits M11a and M11b to the second mirror circuits M12a and M12b and the current marked with "-" flows in a direction opposite to this direction. The computation unit 11b outputs the third current I1c (the first current Ic1a and the second current Ic1b) having an absolute value of a difference between the reference current Ir1 and the input current (the first current Ia and the second current Ib). The third current I1c is generated by the second mirror circuits M12a and M12b.

The A/D converter in which plural stages of circuits sequentially perform comparison (hereafter referred to as the "A/D converter of sequential comparison type") is required to transmit a difference between an input current of each circuit stage and its reference current to the next circuit stage. When the first current I1a, which is the computation result of the preceding circuit stage (the computation unit 11b of the first computation cell 11), is positive (I1a>I1b), that is, when the current Ia (Ib) is less than the reference current Ir1, the next circuit stage (the second computation cell 12) actually needs to be supplied with a negative current. However, each of the first to third computation cells 11 to 13 of the A/D converter 10 transmits a current having the absolute value of a difference between its input current and its reference current to the next stage circuit of the second to fourth computation cells 12 to 14. This inverts the comparison result of each of the second to fourth cells 12 to 14 (the relationship as to which one of the first current and the second current is greater). As a result, the value of the corresponding bit differs from its actual value.

Therefore, the encoder unit 15b corresponding to the second computation cell 12 inverts the value that is based on a result of comparison between the first current and the second current generated by the second computation cell 12 when the computation result of the first computation cell 11 of the preceding stage is negative, that is, when the output of the first encoder unit 15a is 0 (L level). Here, the value of 0 is inverted to the value of 1, and the value of 1 is inverted to the value of 0. The encoder unit 15b corresponding to the second computation cell 12 outputs the signal D2 having the inverted value.

In the same manner, the encoder unit 15c corresponding to the third computation cell 13 inverts the value of the output of the second encoder unit 15b and outputs the signal D1 having the inverted value when the computation result of the second computation cell 12 is negative, that is, when the output of the second encoder unit 15b is 0. Further, the encoder unit 15d corresponding to the fourth computation cell 14 inverts the value of the output of the third encoder unit 15c and outputs the signal D0 having the inverted value when the computation result of the third computation cell 13 is negative, that is, when the output of the encoder unit 15c corresponding to the third computation cell 13 is 0.

The operation of the A/D converter 10 will now be described.

Hereafter, the input current Ai is in the range of 0 to 160 μA, the reference current Ir1 used in the first computation cell 11 is 80 μA, the reference current Ir2 used in the second computation cell 12 is 40 μA, the reference current Ir3 used in the third computation cell 13 is 20 μA, and the reference current Ir4 used in the fourth computation cell 14 is 10 μA.

Example in which the Input Current Ai is 55 μA

The input unit 11a of the first computation cell 11 generates a first current Ia of 55 μA and a second current Ib of 55 μA based on an input current Ai of 55 μA. Further, the input unit 11a supplies the computation unit 11b with the first current Ia and the second current Ib. The first comparison unit 21a of the computation unit 11b generates a first current I1a of 25 μA based on the first current Ia and the reference current Ir1 (80 μA). The second comparison unit 21b of the computation unit 11b generates a second current I1b of −25 μA based on the second current Ib and the reference current Ir1 (80 μA). The second mirror circuit M12a of the first comparison unit 21a mirrors the first current I1a and generates a first current Ic1a of 25 μA and a second current Ic1b of 25 μA. The second mirror circuit M12b of the second comparison unit 21b does not mirror the first current I1b. The first computation cell 11 supplies the second computation cell 12 with the current Ic1 that includes the first current Ic1a of 25 μA and the second current Ic1b of 25 μA. The first encoder unit 15a corresponding to first computation cell 11 differentially amplifies the first current I1a and the second current I1b and outputs an L level signal D3 having a value of 0.

Next, in the second computation cell 12, the first comparison unit 22a compares the first current Ic1a (25 µA) with the reference current Ir2 (40 µA) and generates a first current I2a of 15 µA, and the second comparison unit 22b compares the second current Ic1b (25 µA) with the reference current Ir2 (40 µA) and generates a second current I2b of −15 µA. The second mirror circuit M22a generates a current Ic2 (the first current Ic2a of 15 µA and the second current Ic2b of 15 µA), which is obtained by mirroring the first current I2a. The second computation cell 12 supplies the third computation cell 13 with the current Ic2. The second encoder unit 15b corresponding to the second computation cell 12 differentially amplifies the first current I2a (15 µA) and the second current I2b (15 µA) and generates an L level signal S1. The second encoder unit 15b inverts the signal S1 according to the L level output signal D3 of the first encoder unit 15a of the preceding stage and outputs an H level signal D2 having a value of 1.

Next, the third computation cell 13 compares each of the first current (15 µA) and the second current (15 µA) with the reference current Ir3 (20 µA). The first comparison unit of the third computation cell 13 generates a first current of 5 µA, and the second comparison unit of the third computation cell 13 generates a second current of −5 µA. The second mirror circuit of the third computation cell 13 generates a mirror current of 5 µA of the first current. The third computation cell 13 supplies the fourth computation cell 14 with the mirror current of 5 µA. The third encoder unit 15c corresponding to the third computation cell 13 outputs a signal D1 at an L level having a value of 0 that is the same as the L level of the signal generated by differentially amplifying the first current of 15 µA and the second current of 15 µA in accordance with the H level output signal D2 of the second encoder unit 15b of the preceding stage.

Next, the fourth computation cell 14 compares each of the first current (5 µA) and the second current (5 µA) with the reference current Ir4 (10 µA). The first comparison unit of the fourth computation cell 14 generates a first current of 5 µA, and the second comparison unit of the fourth computation cell 14 generates a second current of −5 µA. The fourth encoder unit 15d corresponding to the fourth computation cell 14 inverts the L level signal generated by differentially amplifying the first current (5 µA) and the second current (5 µA) and outputs an H level signal D0 having a value of 1 in accordance with the L level output signal D1 of the third encoder unit 15c of the preceding stage.

Through the above operations, the A/D converter 10 converts the input current Ai of 55 µA into a digital value, and outputs the digital output signal Do of four bits D3 to D0 (0101).

Example in which the Input Current Ai is 85 µA

In the first computation cell 11, the first current I1a is −5 µA and the second current I1b is 5 µA. Thus, the first computation cell 11 supplies the second computation cell 12 with the current Ic1 (the first current Ic1a and the second current Ic1b) obtained by the second mirror circuit mirroring the second current I1b. The first encoder unit 15a differentially amplifies the first current I1a and the second current I1b and outputs an H level signal D3 having a value of 1.

Next, in the second computation cell 12, the first current I2a is 35 µA and the second current I2b is −35 µA. Thus, the second computation cell 12 supplies the third computation cell 13 with the current Ic2 (the first current Ic2a and the second current Ic2b) obtained by the second mirror circuit mirroring the first current I2a. The second encoder unit 15b generates an L level signal S1 by differentially amplifying the first current I2a and the second current I2b and outputs a signal D2 having the same level as the level of the signal S1 (L level) having a value of 0 in accordance with the output signal D3 (H level) of the first encoder unit 15a.

In the same manner, in the third computation cell 13, the first current is −15 µA and the second current is 15 µA. Thus, the third computation cell 13 supplies the fourth computation cell 14 with the current obtained by the second mirror circuit mirroring the second current. The third encoder unit 15c outputs an L level signal D1 having a value of 0, which is at the same level as the signal generated by differentially amplifying the first current I2a and the second current I2b, in accordance with the output signal D2 of the second encoder unit 15b corresponding to the second computation cell 12 of the preceding stage.

In the same manner, in the fourth computation cell 14, the first current is −5 µA and the second current is 5 µA. Thus, the fourth encoder unit 15d outputs an H level signal D0 having a value of 1, which is obtained by inverting the level of the signal generated by differentially amplifying the first current and the second current, in accordance with the output signal D1 of the third encoder unit 15c corresponding to the third computation cell 13 of the preceding stage.

Through the operations described above, the A/D converter 10 converts the input current Ai of 85 µA into a digital value and outputs the digital signal Do of bits D3 to D0 (1000).

The preferred embodiment of the present invention has the advantages described below.

(1) The A/D converter 10 includes the computation cells 11 to 14, which are connected to each other in series. The number of the computation cells 11 to 14 is equal to the number of the bits of the output signal Do. Each of the computation cells 11 to 14 computes the difference between its input current and a reference current to output a current having an absolute value of the difference. This eliminates the need for additional subsequent circuits, which would otherwise be required in accordance with the difference between an input current and a reference current of each circuit stage. More specifically, the A/D converter 10 does not need to additionally include a circuit for receiving a current when an input current is greater than a reference current and a circuit for receiving a current when a reference current is greater than an input current. The number of the bits of the digital value is increased just by additionally connecting one computation cell in series to the existing cells. This configuration particularly reduces the number of latter circuit stages in a sequential comparison type A/D converter and prevents an increase in the circuit scale of the converter. The decrease in the number of latter circuit stages decreases the number of required constant current supplies for generating reference currents. As a result, the accuracy of the output signal is prevented from being lowered by differences in the reference currents.

(2) The first computation cell 11 includes the first comparison unit 21a, which subtracts the reference current Ir1 from the current Ia to generate the first current I1a, and the second comparison unit 21b, which subtracts the current Ib from the reference current Ir1 to generate the second current I1b. In the same manner as the first computation cell 11, each of the second to fourth computation cells 12 to 14 also includes the first comparison unit and the second comparison unit. This configuration enables a plurality of currents having differences between the input current and reference current to be easily generated in parallel.

(3) The first comparison unit 21a includes the constant current supply C1a, the first mirror circuit M11a, and the second mirror circuit M12a. The constant current supply C1a generates the reference current Ir1. The first mirror circuit M11a subtracts the reference current Ir1 from the current Ia to generate the first current I1a. The second mirror circuit M12a, which is formed by the transistors of which conductivity type differs from that of the transistors included in the first mirror circuit M11a, generates the mirror current of the first current I1a. The second comparison unit 21b includes the constant current supply C1b, the first mirror circuit M11b, and the second mirror circuit M12b. The constant current supply C1b generates the reference current Ir1. The first mirror circuit M11b subtracts the current Ib from the reference current Ir1 to generate the second current I1b. The second mirror circuit M12b, which is formed by the transistors of which conductivity type differs from that of the transistors included in the first mirror circuit M11b, generates the mirror current of the second current I1b. Thus, the first current I1a having a difference between the current Ia and the reference current Ir1, and the second current I1b having a difference between the current Ib and the reference current Ir1 are easily generated by controlling the connecting states of the constant current supplies C1a and C1b to the first mirror circuits M11a and M11b. The second mirror circuits M12a and M12b do not generate a mirror circuit of a current that flows in a certain direction. Positive current that corresponds to the conductivity type of the transistors T23a to T25a and T23b to T25b included in the second mirror circuits M12a and M12b is output, but negative current that does not correspond to the conductivity type of the transistors T23a to T25a and T23b to T25b included in the second mirror circuits M12a and M12b is not output. This configuration enables a current having an absolute value of a difference between an input current and a reference current to be easily output.

(4) The amplification factor of the second mirror circuits M12a and M12b is set at 1. The constant current supplies included in each of the computation cells 12 to 14 of the second and subsequent stages generate reference current that is one half the reference current generated by the current supplies included in the preceding one of the computation cells 11 to 13. It is only required that the transistors T23a to T25a and T23b to T25b included in each stage of the second mirror circuits M12a and M12b be formed to have the same electrical characteristics. An A/D converter with this configuration is easy to manufacture.

(5) The input unit 11a mirrors the analog input current Ai to generate the first current Ia and the second current Ib. The first current Ia is supplied to the first comparison unit 21a. The second current Ib is supplied to the second comparison unit 21b. Thus, the computation unit 11b included in the first computation cell 11 is formed to have the same configuration as the configurations of the second to fourth computation cells 12 to 14. The computation unit 11b and the second to fourth computation cells 12 to 14 are fabricated by repeatedly forming the circuit of the same pattern for a number of times corresponding to the number of bits of the digital value. This configuration enables the A/D converter for outputting a digital value of a plurality of bits to be easily manufactured.

(6) The encoder 15 includes the encoder units 15a to 15d respectively corresponding to the plural stages of the computation cells 11 to 14. The encoder unit 15a corresponding to the computation cell 11 of the first stage includes the differential amplifier circuit 51. The differential amplifier circuit 51 receives input of the first current I1a, which is generated by the first comparison unit 21a, and the second current I1b, which is generated by the second comparison unit 21b, and differentially amplifies the first current I1a and the second current I1b to determine the value of the bit corresponding to the computation cell 11 of the first stage. The encoder unit 15b corresponding to the computation cell 12 of the second stage receives input of the first current I2a, which is generated by the first comparison unit 22a, and the second current I2b, which is generated by the second comparison unit 22b. The encoder unit 15b includes the differential amplifier circuit 61 and the bit adjustment circuit 63. The differential amplifier circuit 61 differentially amplifies the first current I2a and the second current I2b and outputs the resulting signal S1. The bit adjustment circuit 63 determines the value of the corresponding bit in accordance with the output signal S1 of the differential amplifier circuit 61 and the output signal D3 of the encoder unit 15a of the preceding stage. The bit adjustment circuit 63 enables each of the computation cells 11 to 14 to simply output a current having an absolute value to the computation cell of the next stage. This configuration reduces the circuit scale of each circuit stage.

It should be apparent to those skilled in the art that the present invention may be embodied in many other specific forms without departing from the spirit or scope of the invention. Particularly, it should be understood that the present invention may be embodied in the following forms.

In the preferred embodiment, the value of the reference current in the computation cell of each stage may be set in correspondence with the A/D conversion resolution. For example, when the resolution is 5 µA, the four bit A/D converter 10 may set the value of the reference current Ir1 for the first computation cell 11 as 40 µA, the value of the reference current Ir2 for the second computation cell 12 as 20 µA, the value of the reference current Ir3 for the third computation cell 13 as 10 µA, and the value of the reference current Ir4 for the fourth computation cell 14 as 5 µA.

In the preferred embodiment, the encoder 15 includes the plurality of differential amplifier circuits, which compare output currents of the computation cells of the plural stages with one another. Alternatively, the plural stages of the computation cells 11 to 14 may include such differential amplifier circuits.

In the preferred embodiment, the second mirror circuit of each of the computation cells 11 to 14 is formed by three MOS transistors having the same electrical characteristics. However, the amplification factor of the second mirror circuit (ratio of two currents that are mirrored with respect to the input current value) may be changed. The amplification factor of the second mirror circuit that is formed by the MOS transistors having the same electrical characteristics is 1 (the ratio of the output current to the input current is 1). The amplification factor of the second mirror circuit may be changed, for example, to 2. In other words, the MOS transistors may be formed to generate a current twice as large as its input current. When the second mirror circuit is formed in this way, the reference current generated by the constant current supply included in each computation cell is set at the same value. This configuration prevents the comparison accuracy from decreasing.

The A/D converter of sequential comparison type normally includes many stages of comparison circuits. When the A/D converter includes many comparison circuits, a reference current that is compared with an input current (analog amount) in each circuit stage may become extremely small. For example, when an A/D converter for outputting a digital value of 10 bits uses a reference current of 512 µA in its first stage circuit, the reference current used in the final stage circuit may be as small as 1 µA. It is difficult to form a constant current supply for generating such a small reference current. This difficulty results in differences in reference currents used in the plural circuit stages and lowers the accuracy of bits close to the least significant bit (LSB).

To prevent this, the amplification factor of the second mirror circuit may be set, for example, at 2. In this case, the plural circuit stages are provided with reference currents of the same values. This eliminates the need for forming a constant current supply for generating a small current and prevents the accuracy of bits close to the LSB from decreasing. In this case, a reference current used in each circuit stage does not become small depending on the number of computation circuit stages even if the number of bits of the digital value of the sequential comparison type A/D converter is increased, that is, the number of computation circuit stages is increased. This eliminates the need for forming a constant current supply for generating a small reference current and prevents the accuracy of the low-order bits from decreasing.

The A/D converter 10 may be formed by bipolar transistors or bipolar complementary metal oxide semiconductor (Bi-CMOS) transistors.

The present examples and embodiments are to be considered as illustrative and not restrictive, and the invention is not to be limited to the details given herein, but may be modified within the scope and equivalence of the appended claims.

What is claimed is:

1. An A/D converter for converting an analog input current into a digital output signal having a plurality of bits, the A/D converter comprising:
   plural stages of series-connected computation cells, the number of which is equal to the number of bits in said plurality of bits of the digital output signal, the computation cells respectively being supplied with a plurality of input currents, having a plurality of reference currents to compute differences between the corresponding input currents and the reference currents, and outputting a plurality of currents in accordance with absolute values of said differences; and
   an encoder, connected to the computation cells, for determining values for the plurality of bits based on the computations of the computation cells, wherein each computation cell includes:
   a first comparison unit for subtracting the corresponding reference current from the corresponding input current to generate a first current; and
   a second comparison unit for subtracting the corresponding input current from the corresponding reference current to generate a second current;
   each computation cell outputting current that is equal to one of the first current and the second current.

2. The A/D converter according to claim 1, wherein:
   the first comparison unit includes:
   a first constant current supply for generating a reference current;
   a first current mirror circuit for subtracting the reference current generated by the first constant current supply from the corresponding input current to generate the first current, the first current mirror circuit including a plurality of transistors; and
   a second current mirror circuit connected to the first current mirror circuit and including a plurality of transistors of which conductivity type differs from that of the plurality of transistors in the first current mirror circuit, the second current mirror circuit being capable of generating a mirror current of the first current; and the second comparison unit includes:
   a second constant current supply for generating a reference current that is identical to the reference current of the first constant current supply;
   a third current mirror circuit for subtracting the corresponding input current from the reference current of the second constant current supply to generate the second current, wherein the third current mirror circuit includes a plurality of transistors; and
   a fourth current mirror circuit connected to the third current mirror circuit and including a plurality of transistors of which conductivity type differs from that of the plurality of transistors in the third current mirror circuit, wherein the fourth current mirror circuit being capable of generating a mirror current of the second current.

3. The A/D converter according to claim 2, wherein:
   the second current mirror circuit mirrors the first current at an amplification factor of two;
   the fourth current mirror circuit mirrors the second current at an amplification factor of two; and
   the first and second constant current supplies in each one of the computation cells all generate reference currents having the same value.

4. The A/D converter according to claim 2, wherein:
   the second current mirror circuit mirrors the first current at an amplification factor of one;
   the fourth current mirror circuit mirrors the second current at an amplification factor of one; and
   the first and second constant current supplies in each of the computation cells from the one in a second stage generate reference currents of values that are one half the reference currents generated by the first and second constant current supplies of the computation cell in a preceding stage.

5. The A/D converter according to claim 1, wherein the computation cell in a first stage includes an input unit for generating the input current supplied to the first comparison unit and the input current supplied to the second comparison unit from the analog input current.

6. The A/D converter according to claim 1, further comprising:
   an input circuit for receiving the analog input current and mirroring the analog input current to generate the input current supplied to the first comparison unit and the input current supplied to the second comparison unit.

7. The A/D converter according to claim 1, wherein:
   the encoder includes plural stages of encoder units respectively corresponding to the plural stages of computation cells;
   the encoder unit corresponding to the computation cell in a first stage includes a first stage differential amplifier circuit for receiving the first current and the second current from the computation cell in the first stage, differentially amplifying the first current and the second current, and determining a value for the bit corresponding to the computation cell in the first stage; and
   each encoder unit corresponding to one of the computation cells in second and latter stage includes a latter stage differential amplifier circuit and a bit adjustment circuit, the latter stage differential amplifier circuit receiving the first current and the second current generated in the corresponding computation cell and outputting a signal obtained by differentially amplifying the first current and the second current, and the bit adjustment circuit determining a value for the bit for the corresponding computation cell in the second and latter stages in accordance with the signal output by the latter stage differential amplifier circuit and the value determined by the differential amplifier circuit of the encoder unit in a preceding stage.

8. The A/D converter according to claim 7, wherein the bit adjustment circuit determines a value obtained by inverting the output signal of the later stage differential amplifier circuit as the value for the bit for the corresponding computation cell when the value determined by the differential amplifier circuit of the encoder unit of the preceding stage is zero.

9. An A/D converter for converting an analog input current into a digital output signal having a plurality of bits, the A/D converter comprising:

plural stages of series-connected computation cells, the number of which is equal to the number of bits in said plurality of bits of the digital output signal, the computation cells respectively being supplied with a plurality of input currents and having a plurality of reference currents, each of the computation cells supplying the computation cell of a latter stage with difference currents, of the corresponding input current and a corresponding reference current, and a current having an absolute value in accordance with one of the difference currents; and an encoder for determining values for the plurality of bits of the digital output signal based on the difference current of the computation cells, the encoder including plural stages of encoder units respectively connected to the computation cells, the number of the encoder units being equal to the number of bits in said plurality of bits;

wherein the encoder unit in a first stage determines a value for a first bit of the digital output signal in accordance with the difference current supplied from the corresponding computation cell, and the encoder units in second and latter stages determine values of second and latter bits of the digital output signal in accordance with the difference currents supplied from the corresponding computation cells and the value determined by the encoder unit of a preceding stage.

10. An A/D converter for converting an analog input current into a digital output signal having a plurality of bits, the A/D converter comprising:

plural stages of series-connected computation cells, the number of which is eaual to the number of bits in said plurality of bits of the digital output signal, the computation cells respectively being supplied with a plurality of input currents, having a plurality of reference currents to compute differences between the corresponding input currents and the reference currents, and outputting a plurality of currents in accordance with absolute values of said differences; and an encoder, connected to the computation cells, for determining values for the plurality of bits based on the computations of the computation cells, wherein each computation cell includes:

a computation unit for subtracting the corresponding reference current from the corresponding input current to generate a first current and for subtracting the corresponding input current from the corresponding reference current to generate a second current;

each computation cell outputting current that is equal to one of the first current and the second current.

* * * * *